United States Patent
Huang et al.

(10) Patent No.: US 7,300,741 B2
(45) Date of Patent: Nov. 27, 2007

(54) ADVANCED CHEMICALLY AMPLIFIED RESIST FOR SUB 30 NM DENSE FEATURE RESOLUTION

(75) Inventors: Wu-Song S. Huang, Poughkeepsie, NY (US); David R. Medeiros, Ossining, NY (US); Gregory Michael Wallraff, Morgan Hill, CA (US)

(73) Assignee: International Business Machines Corporation, Armonk, NY (US)

(*) Notice: Subject to any disclaimer, the term of this patent is extended or adjusted under 35 U.S.C. 154(b) by 42 days.

(21) Appl. No.: 11/380,098

(22) Filed: Apr. 25, 2006

(65) Prior Publication Data

US 2007/0248908 A1  Oct. 25, 2007

(51) Int. Cl.
G03C 5/00 (2006.01)
G03C 1/492 (2006.01)
G03C 1/494 (2006.01)
G03C 1/76 (2006.01)

(52) U.S. Cl. .................... 430/270.1; 430/322; 430/313
(58) Field of Classification Search ............ 430/270.1, 430/322, 313
See application file for complete search history.

(56) References Cited

U.S. PATENT DOCUMENTS

| | | | |
|---|---|---|---|
| 4,491,628 A | 1/1985 | Ito et al. | |
| 4,731,605 A | 3/1988 | Nixon | |
| 4,855,017 A | 8/1989 | Douglas | |
| 5,362,663 A | 11/1994 | Bronner et al. | |
| 5,429,710 A | 7/1995 | Akiba et al. | |
| 5,562,801 A | 10/1996 | Nulty | |
| 5,618,751 A | 4/1997 | Golden et al. | |
| 5,712,078 A | 1/1998 | Huang et al. | |
| 5,744,376 A | 4/1998 | Chan et al. | |
| 5,801,094 A | 9/1998 | Yew et al. | |
| 5,821,469 A | 10/1998 | Shanmugham | |
| 5,919,597 A | 7/1999 | Sinta et al. | |
| 6,037,097 A | 3/2000 | Bucchignano et al. | |
| 6,043,003 A | 3/2000 | Bucchignano et al. | |
| 6,103,447 A * | 8/2000 | Chen et al. | 430/270.1 |
| 6,227,546 B1 | 5/2001 | Halling | |
| 6,303,263 B1 * | 10/2001 | Chen et al. | 430/270.1 |
| 6,399,273 B1 | 6/2002 | Yamada et al. | |
| 6,420,084 B1 | 7/2002 | Angelopoulos et al. | |
| 2002/0182534 A1 | 12/2002 | Varanasi et al. | |
| 2003/0113658 A1 | 6/2003 | Ebata et al. | |
| 2004/0265747 A1 | 12/2004 | Medeiros et al. | |

FOREIGN PATENT DOCUMENTS

| | | |
|---|---|---|
| JP | PUPA 01-157527 | 6/1989 |
| JP | PUPA 03-282553 | 12/1991 |
| JP | PUPA 05-072747 | 3/1993 |
| JP | PUPA 08-015865 | 1/1996 |
| JP | PUPA 09-320930 | 12/1997 |
| JP | PUPA 10-208997 | 8/1998 |
| JP | PUPA 11-072928 | 3/1999 |
| JP | PUPA 11-194506 | 7/1999 |
| JP | PUPA 11-271965 | 10/1999 |
| JP | PUPA 2002-043215 | 2/2002 |

OTHER PUBLICATIONS

Hinsberg W. et al., "Effect of Resist Components on Image Spreading During Postexposure Bake of Chemically Amplified Resists", *Proceedings of SPIE 3999*:148-160 (2000).
Houle F.A. et al., "Determination of Coupled Acid Catalysis-Diffusion Processes in a Positive-Tone Chemically Amplified Photoresist", *J. Vac. Sci. Technol. B.* 18(4):1874-1885 (2000).
Moreau W., Chapters 12 and 13 of "Semiconductor Lithography, Principles, Practices, and Materials", pp. 567-777 (1988).

* cited by examiner

*Primary Examiner*—Geraldina Visconti
(74) *Attorney, Agent, or Firm*—Scully, Scott, Murphy & Presser. P.C.; Steven Capella, Esq.

(57) ABSTRACT

The present invention discloses a chemically amplified (CA) resist composition for printing features having a dimension of about 30 nm or less and a method of forming a material structure having a pattern containing features having a dimension of about 30 nm or less by using the inventive CA resist. The CA resist composition comprises (a) about 1 to about 50 weight % of a copolymer, (b) about 0.02 to about 25 weight % of a photoacid generator, (c) about 47 to about 99 weight % of a solvent, and (d) about 0.004 to about 25 weight % of a base additive. The copolymer comprises at least one hydrophilic monomer unit containing one or more polar functional groups and at least one hydrophobic monomer unit containing one or more aromatic groups. Some, but not all, of the one or more polar functional groups in the copolymer are protected with acid labile moieties having a low activation energy.

19 Claims, No Drawings

ADVANCED CHEMICALLY AMPLIFIED RESIST FOR SUB 30 NM DENSE FEATURE RESOLUTION

FIELD OF THE INVENTION

This invention relates to a chemically amplified (CA) resist composition for printing features having a dimension of about 30 nm or less and a method of forming a material structure having a pattern containing features having a dimension of about 30 nm or less on a substrate by using the inventive CA resist composition in lithography.

BACKGROUND OF THE INVENTION

The microelectronics industry strives toward fabricating high density circuitry by decreasing the minimum feature size of the components on the chip. This requires high-resolution lithography, the principal technique used in patterning microelectronics circuitry. Over approximately the last 20 years, the industry has migrated to shorter wavelength photolithography as the primary means of scaling the resolution to sustain the progressive demand for smaller features. The wavelength of photolithography has migrated from mid-ultraviolet (MUV) wavelengths (350-450 nm) to deep-UV (DUV) radiation (190-300 nm) and vacuum UV (VUV, 125-160 nm). Likewise, the photosensitive materials used in photolithography, i.e., photoresists, have evolved. MUV lithography employed diazonaphthoquinone (DNQ) and novolak-based resists. These materials offered high performance, but were not extendible to DUV and VUV wavelengths due to their opacity at these shorter wavelengths. In addition, these resists were not of sufficient sensitivity to afford high throughput manufacturing.

In response to the need for new, lower opacity, higher sensitivity materials for DUV imaging, Ito et al. disclosed in U.S. Pat. No. 4,491,628 the development of chemically amplified (CA) resists based on photochemically-generated-acid catalyzed deprotection of an acid labile polymer. That is, for positive tone CA resists, acid labile moieties of the polymer are cleaved by acid catalyzed thermolysis reaction that renders the deprotected form of the polymer soluble in a subsequently applied developer, such as an aqueous base. Thus, an image of the projected patternwise radiation is formed in the resist film after development, which can then serve as an etch-resistant mask for a subsequent pattern transfer step. The resolution obtained is dependent on the quality of aerial image and the ability of resist to maintain that image.

CA resists have been developed for 248, 193, and 157 nm lithography. The theoretical dimensional limit of equal-sized half-pitch features is one quarter of the wavelength, $\lambda$ ($K_1$=0.25) when NA=1, as the dose applied to the resist is equal to the square of the intensity, and thus the resolution cannot be modulated by any more than $\lambda/4$, or a pitch of $\lambda/2$. The term "$K_1$", as used herein, refers to one of the Rayleigh K factors which are process dependent constants as shown in the following equation: $R=K_1\lambda/NA$. The resolution attainable with each advancing generation of materials has been extended towards these limits through the use of low $K_1$ techniques and high numerical aperture tools. For the latest VUV wavelength being developed for manufacturing, 157 nm, with a very high, but potentially manufacturable NA of 0.95, $\lambda/4$ equals about 40 nm. To obtain images below this feature size, either an extension of NA to >1, such as is afforded with immersion lithography, or a non-diffraction limited, non-optical lithography system, such as the so-called next generation lithography (NGL) has to be applied. The most promising of these NGLs are extreme ultraviolet (EUV, sometimes referred to as soft x-ray) or electron beam lithography (EBL).

One barrier to imaging in the sub-50 nm half-pitch regime is a phenomenon known as image blur, which diminishes the integrity of the pattern (see, for example, Hinsberg et al., Proc. SPIE, 2000, 3999, 148 and Houle et al., J. Vac. Sci. Technol B, 2000, 18, 1874). Image blur can be defined as the deviation of the developable image from the projected aerial image. Image blur can be divided into two contributing factors: gradient-driven acid diffusion and reaction propagation. Both factors contribute to blur, but to different degrees and with different temperature dependence.

The first factor contributing to image blur is often referred to as acid diffusion and can be described by Fickian diffusion models for solids. The choice of the photoacid being generated from photoacid generator (PAG) and the mobility in the chosen polymer matrix dictate this factor. The mobility in the polymer matrix is dependent on the comprising chemical functionality of the polymer, the free volume of the matrix, the glass transition temperature (Tg) of the polymer and the temperature and time of baking the steps encountered during the resist processing.

A second contributing factor to image blur is sometimes described as reaction propagation and is best described by Arhenius behavior. Activation energy (enthalpy), volatility of products (entropy), and the availability and concentration of deprotection-reaction-dependent co-reactants, such as moisture, dictate the degree to which the reaction propagates away from the original acid profile.

Since the image blur resulting from diffusion of photochemically generated acid has been determined to be on the order of 10's of nm's and is enhanced by post-exposure baking (PEB), it is extremely difficult to create dense (1:1) device features around 50 nm or less using conventional CA resists. In order to achieve high resolution, high sensitivity and high degree of process latitude, both image blur factors must be eliminated or minimized. Both of these contributing factors can be tempered by the addition of acid-quenchers, or bases, which have been shown to reduce image blur. Additionally, it has been recognized that image blur is temperature dependent. Breyta et al. disclose that appropriate baking conditions can optimize the resolution attainable with CA resists in U.S. Pat. No. 6,227,546. Medeiros et al. disclose a method of fabricating sub-50 nm dense features using a CA resist based on acid labile protecting groups having a low activation energy in U.S. Patent Application Publication No. 2004/0265747 A1.

However, in order to print sub 30 nm features, it is required that a CA resist possesses dissolution properties different from those of the above-mentioned prior art resist so that the image collapsing problem in thin film imaging can be prevented. A CA resist is also required to further reduce the diffusion of the photochemically-generated-acid and, at the same time, maintain the desired sensitivity to consistently print sub 30 nm features. In addition, EUV radiation causes a flare problem that limits CA resist performance. Thus, a CA resist has to possess certain optical properties and dissolution characteristics to reduce flare in printing sub 30 nm images.

In view of the above discussion, there remains a need for an advanced CA resist composition for sub 30 nm dense feature resolutions and a method of performing sub 30 nm imaging.

SUMMARY OF THE INVENTION

Accordingly, the present invention provides a chemically amplified (CA) resist composition for printing features having a dimension of about 30 nm or less. The inventive CA resist comprises (a) about 1 to about 50 weight % of a copolymer, (b) about 0.02 to about 25 weight % of a photoacid generator, (c) about 47 to about 99 weight % of a solvent, and (d) about 0.004 to about 25 weight % of a base additive. The copolymer employed in the present invention comprises at least one hydrophilic monomer unit containing one or more polar functional groups and at least one hydrophobic monomer unit containing one or more aromatic groups. Some, but not all, of the one or more polar functional groups are protected with acid labile moieties having a low activation energy.

The present invention also provides a method of forming a pattern containing features having a dimension of about 30 nm or less on a substrate, said method comprising: applying the inventive chemically amplified (CA) resist composition to a substrate to form a CA resist layer on the substrate; patternwise exposing the CA resist layer to an imaging radiation; treating the exposed CA resist layer with a deprotection reaction-dependent co-reactant; developing a patterned CA resist structure in the exposed CA resist layer; and transferring the pattern in the patterned resist CA structure to the substrate.

DETAILED DESCRIPTION OF THE INVENTION

As stated above, the present invention is directed to a chemically amplified (CA) resist composition for printing features having a dimension of about 30 nm or less. The CA resist is developable in an aqueous alkaline developer and comprises (a) about 1 to about 50 weight % of a copolymer, (b) about 0.02 to about 25 weight % of a photoacid generator, (c) about 47 to about 99 weight % of a solvent, and (d) about 0.004 to about 25 weight % of a base additive. The copolymer comprises at least one hydrophilic monomer unit containing one or more polar functional groups and at least one hydrophobic monomer unit containing one or more aromatic groups. Some, but not all, of said one or more polar functional groups are protected with acid labile moieties having a low activation energy. The term "hydrophilic" as used herein denotes having a strong affinity for water, tending to dissolve in, mix with, or be wetted by water. The term "hydrophobic" as used herein denotes lacking affinity for water, tending to repel and not absorb water; tending not to dissolve in or mix with or be wetted by water. By "acid labile moiety", it is meant any chemical moiety that readily undergoes deprotection reaction in the presence of acids. By "activation energy", it is meant the threshold energy or the energy that must be overcome in order for a chemical reaction (e.g., deprotection reaction) to occur. The term "low activation energy" as used herein denotes an activation energy having an Ea of about 20 kcal/mol. or less.

The inventive copolymer may further comprise a polymer backbone that includes, but is not limited to: polyolefins, polyolefin sulfones, polyketones, and polyethers. Preferably, the polymer backbone is polyethylene.

The at least one hydrophilic monomer unit containing one or more polar functional groups imparts hydrophilicity to the inventive copolymer so that the CA resist of the present invention is soluble and developable in an aqueous alkaline developer. The at least one hydrophobic monomer unit containing one or more aromatic groups imparts hydrophobicity to the inventive copolymer so that the dissolution rate of the CA resist of the present invention in the aqueous alkaline developer may be substantially reduced. That is, the at least one hydrophobic monomer unit containing one or more aromatic groups adjusts dissolution characteristics of the inventive copolymer. The dissolution property of the copolymer may be adjusted by varying the molar ratio of the at least one hydrophilic monomer unit containing one or more polar functional groups to the at least one hydrophobic monomer unit containing one or more aromatic groups, or by introducing additional co-monomer units. Preferably, the inventive copolymer has a dissolution rate of about 100 nm per second or less in a tetramethyl ammonium hydroxide (TMAH) developer having a concentration of about 0.2 to about 0.3 N. More preferably, the inventive copolymer has a dissolution rate of about 100 nm per second or less in 0.263N TMAH developer. The above-mentioned dissolution rates refer to a dissolution rate at a temperature of about 0° to about 60° C., with the range of about 20° to about 25° C. more preferred. The at least one hydrophobic monomer unit containing one or more aromatic groups also adjusts the optical properties of the inventive copolymer so that the CA resist of the present invention can minimize the flare problem when exposed to EUV radiation.

Depending on the intended use and desired performance, the at least one hydrophilic monomer unit containing one or more polar functional groups and the at least one hydrophobic monomer unit containing one or more aromatic groups of the present invention may be in a molar ratio from about 95:5 to about 5:95, with a molar ratio in the range from about 90:10 to about 50:50 more preferred.

It is preferred that about 5 to about 99 mol % of the one or more polar functional groups in the inventive copolymer are replaced with acid labile moieties having a low activation energy. It is more preferred that about 10 to about 90 mol % of the one or more polar functional groups in the inventive copolymer are replaced with the acid labile moieties having the low activation energy. In the present invention, the acid labile moieties having a low activation energy are preferably cleavable in the presence of acid at a temperature of about 110° C. or less so that image blur is minimized or avoided. The lability of the acid labile moieties is preferably dependent on the presence of a co-reactant which enables and/or facilitates the cleaving of the acid labile group in the presence of a generated acid. The co-reactant is preferably water or an alcohol, more preferably water. The co-reactant may be present in the resist layer prior to imaging and/or may be introduced during or after imaging. Preferably, the co-reactant is not present in the resist prior to exposure to imaging radiation.

The acid labile moieties suitable for the present invention may be any acid labile moiety having a low activation energy. Preferred acid labile moieties having the low activation energy of the present invention include, but are not limited to: acetals, ketals, and orthoesters. More preferred acid labile moieties having the low activation energy are ketal moieties. The most preferred acid labile moieties having the low activation energy are aliphatic ketals having 4 to 40 carbon atoms. The aliphatic ketals suitable for the present invention may contain straight, branched, or cyclic alkyl groups. Examples of non-cyclic aliphatic ketals include, but are not limited to: methoxy propyl, methoxy butyl, and methoxy pentyl. Examples of cyclic aliphatic ketals include, but are not limited to: methoxycyclopropanyl, ethoxycyclopropanyl, butoxycyclohexanyl, methoxycyclobutanyl, ethoxycyclobutanyl, methoxycyclopentanyl, ethoxycyclopentanyl, methoxycyclohexanyl, ethoxycyclohexanyl, propoxycyclohexanyl, methoxycycloheptanyl, methoxycyclooctanyl and methoxyadamantyl. In preferred embodiment of the present invention, the acid labile moieties having a low activation energy are cyclic aliphatic ketals.

The term "polar functional groups" as used herein denotes any chemical group in which the distribution of electrons is uneven enabling it to take part in electrostatic interactions. The one or more polar functional groups suitable for the present invention include, but are not limited to: hydroxyl and carboxylate functional groups. The one or more polar functional groups impart hydrophilicity to the at least one hydrophilic monomer unit. Examples of the at least one hydrophilic monomer unit containing one or more polar functional groups suitable for the present invention include, but is not limited to: p-hydroxystyrene, m-hydroxystyrene, o-hydroxystyrene, and substituted analogs thereof.

The term "aromatic group" as used herein denotes an organic radical derived from an aromatic compound by the removal of one hydrogen atom. The term "an aromatic compound" as used herein denotes an organic compound characterized by increased chemical stability resulting from the delocalization of electrons in one or more rings containing usually multiple conjugated double bonds. The aromatic moiety of the present invention may be carbocyclic or heterocyclic. By "carbocyclic aromatic moiety", it is meant an aromatic moiety containing only hydrogen atoms and carbon atoms. By "heterocyclic aromatic moiety", it is meant an aromatic moiety containing one or more heteroatoms selected from nitrogen, oxygen, sulfur, or a combination thereof in the aromatic ring(s). The aromatic moiety may be monocyclic or polycyclic. The rings in the polycyclic aromatic moiety may be fused or non-fused. The one or more aromatic groups impart hydrophobicity to the at least one hydrophobic monomer unit. The at least one hydrophobic monomer unit containing one or more aromatic groups suitable for the present invention include, but is not limited to: styrenes, vinyl napthalene, vinyl anthracene, or substituted analogs thereof.

One preferred embodiment of the inventive copolymer comprises the following structure:

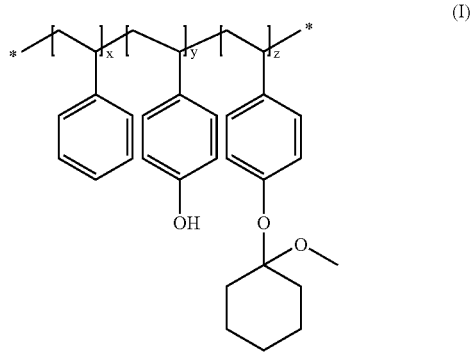

(I)

wherein x, y, and z are the same or different, and are integers of 5-500. Preferably, x, y, and z are in a ratio of about 15:68:17.

It is also preferable that the inventive copolymer has a tunable polymer molecular weight with average molecular weight ranging from about 1K to about 500K Daltons to enable the formulation of high solid content spin castable solutions with adequate viscosity. More preferably, the weight average molecular weight of the inventive copolymer ranges from about 1K to about 200K Daltons. Additional co-monomers can also be added to prepare copolymer materials with improved mechanical durability and/or to adjust the optical property of the copolymer.

A "photoacid generator", also known as PAG, is a compound that generates an acid molecule upon illumination. The PAGs suitable for the present invention may be any photosensitive acid generator that is known in the resist art and compatible with other selected components of the inventive CA resist composition, particularly positive resist compositions. PAGs suitable for the present invention include, but are not limited to: sulfones, sulfonates, carboxylates, onium salts, and combinations thereof. The PAGs used in the present invention may be one type of PAG or a combination of different types of PAGs.

In the present invention, it is preferred that the photoacid generator is an onium salt. The onium salts suitable for the present invention include, but are not limited to: iodonium salts, sulfonium salts, or a mixture thereof. It is more preferred that the photoacid generators are sulfonium or iodnium sulfonates, the anions of which are partially or totally substituted with fluorine atoms. In one embodiment of the present invention, the partially fluorine substituted anion of the photoacid generator comprises the following structure:

(I)

wherein $R^2$ is an aromatic moiety or aliphatic moiety or the combination thereof. As used herein, the term "aliphatic moiety" denotes a hydrocarbon radical having carbon atoms linked in open chains. The aliphatic moieties suitable for the present invention may be straight or branched and include, but are not limited to: alkyl, alkenyl, and alkynyl. The term "aromatic moiety" is defined as described above.

It is more preferred that the photoacid generators are strong acids with fluorinated substituents, such as, for example, triaryl sulfonium perfluoroalkylsulfonates. The term "aryl" as used herein denote an organic radical derived from an aromatic compound by the removal of one hydrogen atom. The term "aromatic compound" is defined as described above. By "perfluoroakyl", it is meant an alkyl group wherein all hydrogen atoms on the carbon backbone are substituted by fluorine atoms. Perfluoroalkyl suitable for the present invention may be straight, branched, or cyclic perfluoroalkyl having 1 to 6 carbon atoms. Examples of triaryl sulfonium perfluoroalkylsulfonate suitable for the present invention include, but are not limited to: triphenylsulfonium triflate, triphenylsulfonium nonaflate, tris(t-butylphenyl)sulfonium triflate, t-butylphenyl diphenylsulfonium triflate, t-butylphenyl diphenylsulfonium nonaflate, t-butylphenyl diphenylsulfonium, perfluorooctanesulfonate, and similar derivatives and analogs thereof.

In one embodiment of the present invention, the PAGs are compounds comprising the following structure:

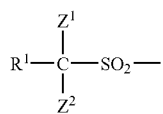

(II)

wherein $R^1$ is a monovalent organic group with a fluorine content of 50 weight % or less, a nitro group, a cyano group, or a hydrogen atom; and $Z^1$ and $Z^2$ are the same or different, are independently a fluorine atom or a straight or branched perfluoroalkyl group having 1 to 10 carbon atoms. The term "perfluoroalkyl" is defined as described above. Examples of perfluoroalkyl suitable for the present invention are described in U.S. Patent Application Publication No. U.S. 2003/0113658 A1, the disclosure of which is herein incorporated by reference.

It is also more preferred that the photoacid generators are strong acids without fluorinated substituents, such as, for example, a triaryl sulfonium sulfonate having an anion comprising one of the following structures:

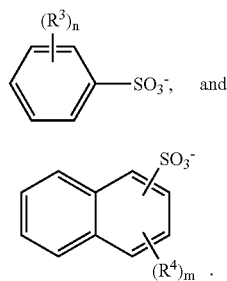

wherein $R^3$ and $R^4$ are the same or different, and are independently a nitro group, a cyano group, or a mixture thereof, n is an integer of 1 to 5; and m is an integer of 1 to 7.

Other examples of PAGs suitable for the present invention include, but are not limited to: (trifluoromethylsulfonyloxy)-bicyclo[2.2.1]hept-5-ene-2,3-dicarboximide ("MDT") and sulfonic acid esters of N-hydroxy-amides or imides, as described in U.S. Pat. No. 4,731,605, the disclosure of which is incorporated by reference herein. The PAGs suitable for the present invention also include PAGs that produce weaker acids, such as, for example, dodecane sulfonate of N-hydroxy-naphthalimide ("DDSN").

The base additive suitable for the present invention may be any basic organic compound which can quench an acid and limit the extent of image blur. In the present invention, a preferred base additive is a tetra-alkylammonium hydroxide. Suitable alkyl groups in the tetra-alkylammonium hydroxide may be a straight, branched, or cyclic alkyl group having 1 to 6 carbon atoms. Examples of the tetra-alkylammonium hydroxide include, but are not limited to: tetra-ethylammonium hydroxide, tetra-propylammonium hydroxide, and tetra-butylammonium hydroxide.

It is most preferred that PAGs used for the present invention are compounds which generate very strong acids upon exposure to imaging radiation so that the deprotection reactions of the acid labile moieties having a low activation energy are quickly initiated, and base additives used for the present invention are very strong bases which can effectively quench the excessive photochemically generated acids. The PAG load, i.e., the weight % of the PAG, in the inventive CA resist composition is higher than that in the prior art CA resist, thus more acids are generated upon imaging radiation. The base additive load, i.e., the weight % of the base additive, in the inventive CA resist composition is also higher than that in the prior art CA resist so that deprotection range of the acid labile moieties is reduced.

The inventive CA resist composition may further comprise at least one surfactant. The surfactants that can be employed in the invention are those that are capable of improving the coating homogeneity of the inventive antireflective coating composition. Illustrative examples of such surfactants include, but are not limited to: fluorine-containing surfactants such as 3M's FC-430®, FC-4430® and the like, siloxane-containing surfactants such as Union Carbide's SILWET® series and the like, or a mixture thereof.

It is preferred that the inventive CA resist composition may contain about 10 to about 500 ppm of the at least one surfactant, based on the total weight of the polymer. More preferably, the inventive CA resist composition may contain about 50 to about 300 ppm of the at least one surfactant, based on the total weight of the polymer.

In another aspect of the invention, the inventive CA resist composition may be used in a method of forming a patterned substrate. The patterned substrate contains features having a dimension of about 30 nm or less. The inventive method comprises:

applying the inventive chemically amplified (CA) resist composition to a substrate to form a CA resist layer on the substrate;

patternwise exposing the CA resist layer to an imaging radiation;

treating the exposed CA resist layer with a deprotection reaction-dependent co-reactant;

developing a patterned CA resist structure in the exposed CA resist layer; and transferring the pattern in the patterned CA resist structure to the substrate.

The substrate may be any desired substrate such as a semiconductor wafer, a mask blank, and the like. The substrate is preferably a silicon semiconductor wafer. The substrate may or may not have additional layers of materials already deposited on it, including patterned or unpatterned layers containing multiple materials which may be in the form of device features, wires, and the like. The material layer is preferably selected from the group consisting of organic dielectrics, metals, ceramics, and semiconductors. The material layer may be formed by any conventional technique (e.g., by implanting, spin-coating, CVD, PVD, etc.). The invention is not limited to any specific substrate, material layer or method of providing such material layer.

The inventive CA resist is typically cast from an appropriate solvent. Preferred solvents are propylene glycol monomethyl ether acetate (PGMEA), ethyl lactate, 4-methyl-2-pentanol, cyclohexanone, or a mixture thereof.

The CA resist layer is preferably formed on the substrate by spin coating, slot coating or by other methods known to those skilled in the art. The coating thickness is preferably appropriate for the target feature size taking into consideration of the numerical aperture or resolution capability of the imaging device, the material layer to be patterned, and other relevant factors. The inventive CA resist composition is typically applied onto a surface of a suitable substrate by coating applications well known to those skilled in art so that a thin film resist having a thickness from about 0.02 to about 10 μm is achieved.

After applying the CA resist, the CA resist layer is preferably baked mildly to remove the casting solvent (also known as post-application bake or PAB). The baking temperature is preferably such that the majority or all of the solvent is dispelled from the resist without causing thermally-induced deprotection or decomposition of resist components. A preferred baking temperature is from about 80° to 120° C., more preferably about 90° to about 110° C. The post-application bake step is preferably conducted for about 10 seconds to about 15 minutes, more preferably about 15 seconds to about one minute.

The CA resist layer is then exposed to an imaging radiation in a pattern corresponding to a desired structure (to be created by pattern transfer to the underlying material layer) having features having a dimension of about 30 nm or less. The exposure radiation is preferably selected from the group consisting of EUV radiation (13.4 nm), electron beams (EB), ion beams (IB), x-rays (1.4 nm, 1.1 nm), VUV (using extremely low $K_1$ factor (about 0.25) and NA>1), or DUV (using extremely low $K_1$ factor (about 0.25) and NA>1). During radiation exposure of the CA resist layer, acid is generated by the photoacid generator in exposed regions of the CA resist layer. Thus, the exposure causes formation of a corresponding pattern of latent acid in the CA resist layer.

The exposure step is preferably conducted in the substantial absence of deprotection-reaction-dependent co-reactants (or at least in the absence of such co-reactants in the environment surrounding the resist layer in the imaging tool). In embodiments where the resist used is a KRS-type resist, a co-reactant for deprotection reaction propagation is water. By "KRS-type resist", it is meant ketal resist system. Thus, the exposure environment preferably has a relative humidity (RH) less than about 10%, more preferably less than about 1%, most preferably less than about 0.1%. EUV, EB, IB and x-ray exposure tools typically provide a moisture-free environment by providing high vacuum during the exposure. Optical radiation exposure tools can achieve a substantially anhydrous environment by use of vacuum or rigorous purging with a dry, inert gas such as nitrogen, helium or argon.

After the radiation exposure, a post-exposure environment containing one or more deprotection-reaction-dependent co-reactants is provided for the substrate. The environment preferably contains sufficient concentration of the deprotection-reaction-dependent co-reactant and has a temperature suitably low enough to prevent significant image blur, but not so low as to stop the deprotection reaction entirely. When water is the co-reactant, the environment preferably has a relative humidity of about 10% to about 80%, more preferably about 30% to about 60%, most preferably about 35% to about 50%. The temperature of the environment is preferably selected in combination with the concentration of co-reactant to provide a post-exposure treatment time on the order of about 30 seconds to about 45 minutes, more preferably about 1 to about 30 minutes, most preferably about 1 to about 5 minutes. The post-exposure environment temperature is preferably about 10° to about 110° C., more preferably about 15° to about 60° C., most preferably about 20° to about 50° C. The exposed CA resist layer is treated with a deprotection reaction-dependent co-reactant for a time sufficient to promote acid-catalyzed reaction in exposed portions of the CA resist layer but not so long as to cause resolution degradation due to acid diffusion-induced blur.

After the post-exposure treatment as described above, a patterned CA resist structure is then developed by contacting the resist with an aqueous alkaline developer or other known developing agent, thereby the exposed portions of the exposed CA resist layer are removed. A preferred developer is an aqueous solution of tetramethyl ammonium hydroxide (TMAH). A preferred concentration of the aqueous TMAH solution is about 0.1 to 0.4 N (normal), more preferably about 0.2 to 0.3 N. If desired, surfactants or other additives may be employed in the developer solution, e.g., to aid in solvation and/or to prevent image collapse.

The pattern from the resist structure may then be transferred to the underlying substrate (e.g., organic dielectric, ceramic, metal or semiconductor). Typically, the transfer is achieved by dry etching (e.g., reactive ion etching, plasma etching, ion beam, etc.), wet etching, or some other suitable technique. The methods of the invention can be used to create patterned material layer structures such as metal wiring lines, holes for contacts or vias, insulation sections (e.g., damascene trenches or shallow trench isolation), trenches for capacitor structures, gate stacks, etc. as might be used in the design of integrated circuit devices. In some instances, a hard mask may be used below the resist layer to facilitate transfer of the pattern to a further underlying material layer or section. Examples of pattern transfer are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

The following examples are provided to illustrate the inventive resist composition and some advantages in using the same.

EXAMPLE 1

Synthesis and Formulation of the Resists for Lithographic Evaluations

Two polymers were used in synthesizing methoxycyclohexene (MOCH) protected polymers for E-beam and EUV exposures. One was a polyhydroxystyrene homopolymer having a molecular weight of about 5000 (VP5000, from Nippon Soda), the other was a hydroxystyrene and styrene copolymer having a molecular weight of about 3700 (VPS3513, from Nippon Soda). VP3513 contained 85 mole % hydroxystyrene and 15 mole % styrene. VPS3513 was chosen based on its suitable dissolution rate which was within a preferable range of this invention. A quartz crystal microbalance (QCM) manufactured by Maxtek, Inc., Santa Fe, Calif. was used to measure the dissolution rates of the homopolymer and copolymer films in an aqueous 0.263 N tetramethylammonium hydroxide (TMAH), by measuring frequency and resistance using 5 MHz crystals at room temperature (around 22° C.). VP5000 exhibited a dissolution rate of 304 nm/s, while VPS3513 exhibited a dissolution rate of 78.3 nm/s. MOCH protections of these two polymers were carried out with the procedures described in U.S. Pat. Nos. 6,037,097 and 6,420,084, the disclosures of which are incorporated herein by reference. The protection level of VP5000 was 25% of the phenol group, while the protection level of the VPS3515 was 20% of the phenol group (17 mole % of the polymer units). Three formulations were prepared for comparative experiments: Formulation A contained 0.7 weight % triphenylsulfonium tirflate (TPSTRF) and 0.14 weight % tetrbutylammonium hydroxide (TBAH) in the 25 mole % MOCH protected VP5000, Formulation B contained 2.8 weight % TPSTRF and 0.56 weight % TBAH in the 17 mole % MOCH protected VP3515, and Formulation C contained 5.6 weight % TPSTRF and 1.12 weight % TBAH in the 17 mole % MOCH protected VP3515. All weight % described above were relative to the polymers. The solid contents of above formulations were 3 weight % in PGMEA.

EXAMPLE 2

Lithographic Evaluations

Resist formulations obtained from EXAMPLE 1 were spin coated with 3000 rpm on HMDS primed wafers. The films were baked on a hot plate at 90° C. for 1 minute to obtain thicknesses around 50 nm range. The exposures were performed on a 100 kV Leica exposure system. After exposure, the resists were allowed to sit in the regular lab environment for 30 minutes without PEB before being developed with 0.263 N TMAH for 20 s. High resolution of 20 nm and 30 nm l/s images were obtained on Formulation B and C at 32 µC/cm$^2$ (proximity corrected dose) with 30 nm resist lines standing, and 20 nm l/s images were resolved with lines collapsed, while formulation A only resolved 30 nm l/s images. High resolution of 20 nm l/s images were also resolved with Formulation C coated on AR3 ARC (from Rohm Haas Company). When the solid content was reduced to 2.7 weight %, the thickness of coated resist film of Formulation C was around 45 nm. At this thickness 25 nm l/s images were resolved without lines collapsed, while the 20 nm images were resolved with some portion of the lines collapsed. When the solid content reduced to 2.4 weight %, the thickness of coated resist film of Formulation C was around 39 nm. 20 nm l/s images were resolved without lines collapsed but the surface was very rough. Resist Formulation C also showed high resolution of 30-35 nm l/s images consistently under EUV exposures and could also resolve 25 nm l/s images, while Formulation A rarely resolved sub 30 nm l/s images under EUV exposures.

While the present invention has been particularly shown and described with respect to preferred embodiments thereof, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

Having thus described our invention in detail, what we claim as new and desire to secure by the Letters Patent is:

1. A chemically amplified resist composition for printing features having a dimension of about 30 nm or less comprising (a) about 1 to about 50 weight % of a copolymer having a dissolution rate of about 100 nm per second or less in 0.263N tetramethyl ammonium hydroxide (TMAH) developer, (b) about 0.02 to about 25 weight % of a photoacid generator, (c) about 47 to about 99 weight % of a solvent, and (d) about 0.004 to about 25 weight % of a base additive; said copolymer comprising at least one hydrophilic monomer unit containing one or more polar functional groups and at least one hydrophobic monomer unit containing one or more aromatic groups, wherein some, but not all, of said one or more polar functional groups are protected with acid labile moieties having a low activation energy.

2. The chemically amplified resist composition of claim 1, wherein the at least one hydrophilic monomer unit containing one or more polar functional groups and the at least one hydrophobic monomer unit containing one or more aromatic groups are in a ratio from about 90:10 to about 50:50.

3. The chemically amplified resist composition of claim 1, wherein about 5 to about 99 mol % of the one or more polar functional groups are replaced with the acid labile moieties having the low activation energy.

4. The chemically amplified resist composition of claim 1, wherein the one or more polar functional groups are hydroxyl or carboxylate functional groups.

5. The chemically amplified resist composition of claim 1, wherein the copolymer further comprises a polymer backbone selected from the group consisting of polyolefins, polyolefin sulfones, polyketones, and polyethers.

6. The chemically amplified resist composition of claim 1, wherein the at least one hydrophilic monomer unit containing one or more polar functional groups is selected from the group consisting of p-hydroxystyrene, m-hydroxystyrene, o-hydroxystyrene, and substituted analogs thereof.

7. The chemically amplified resist composition of claim 1, wherein the at least one hydrophobic monomer unit containing one or more aromatic groups are selected from the group consisting of styrenes, vinyl napthalene, vinyl anthracene, and substituted analogs thereof.

8. The chemically amplified resist composition of claim 1, wherein the acid labile moieties having the low activation energy are selected from the group consisting of acetals, ketals, and orthoesters.

9. The chemically amplified resist composition of claim 1, wherein the acid labile moieties having the low activation energy are cyclic aliphatic ketals.

10. The chemically amplified resist composition of claim 9, wherein the cyclic aliphatic ketals are selected from the group consisting of methoxycyclopropanyl, ethoxycyclopropanyl, butoxycyclohexanyl, methoxycyclobutanyl, ethoxycyclobutanyl, methoxycyclopentanyl, ethoxycyclopentanyl, methoxycyclohexanyl, ethoxycyclohexanyl, propoxycyclohexanyl, methoxycycloheptanyl, methoxycyclooctanyl and methoxyadamantyl.

11. The chemically amplified resist composition of claim 1, wherein the photoacid generator is selected from the group consisting of sulfones, sulfonates, carboxylates, onium salts, and combinations thereof.

12. The chemically amplified resist composition of claim 11, wherein the photoacid generator is a triaryl sulfonium perfluoroalkylsulfonate.

13. The chemically amplified resist composition of claim 12, wherein the triaryl sulfonium perfluoroalkylsulfonate is selected from the group consisting of triphenylsulfonium triflate, triphenylsulfonium nonaflate, tris(t-butylphenyl)sulfonium triflate, t-butylphenyl diphenylsulfonium triflate, t-butylphenyl diphenylsulfonium nonaflate, t-butylphenyl diphenylsulfonium, and perfluorooctanesulfonate.

14. The chemically amplified resist composition of claim 1, wherein the solvent is selected from the group consisting of propylene glycol monomethyl ether acetate, ethyl lactate, 4-methyl-2-pentanol, and cyclohexanone.

15. The chemically amplified resist composition of claim 1, wherein the base additive is a tetra-alkylammonium hydroxide.

16. The chemically amplified resist composition of claim 1, wherein the copolymer has a tunable molecular weight ranging from about 2K Daltons to about 200K Daltons.

17. The chemically amplified resist composition of claim 1 further comprising at least one surfactant.

18. A method of forming a pattern containing features having a dimension of about 30 nm or less on a substrate, said method comprising:

applying a chemically amplified (CA) resist composition to a substrate to form a CA resist layer on the substrate, the CA resist composition comprising (a) about 1 to about 50 weight % of a copolymer having a dissolution rate of about 100 nm per second or less in 0.263 N tetramethyl ammonium hydroxide (TMAH) developer, (b) about 0.02 to about 25 weight % of a photoacid generator, (c) about 47 to about 99 weight % of a solvent, and (d) about 0.04 to about 25 weight % of a base additive, the copolymer comprising at least one hydrophilic monomer unit containing one or more polar functional groups and at least one hydrophobic monomer unit containing one or more aromatic groups, wherein some, but not all, of said one or more polar functional groups are protected with acid labile moieties having a low activation energy;

patternwise exposing the CA resist layer to an imaging radiation;

treating the exposed CA resist layer with a deprotection reaction-dependent co-reactant;

developing a patterned CA resist structure in the exposed CA resist layer; and transferring the pattern in the patterned CA resist structure to the substrate.

19. The method of claim 18, wherein said treating is performed at a temperature from about 10° to about 110° C.

* * * * *